(12) United States Patent
Jung et al.

(10) Patent No.: US 9,911,505 B2
(45) Date of Patent: Mar. 6, 2018

(54) COST EFFECTIVE SEMICONDUCTOR DEVICES AND SEMICONDUCTOR SYSTEMS WITH REDUCED TEST TIME

(71) Applicant: SK hynix Inc., Icheon-si Gyeonggi-do (KR)

(72) Inventors: Chul Moon Jung, Icheon-si (KR); Mi Hyun Hwang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 144 days.

(21) Appl. No.: 14/947,717

(22) Filed: Nov. 20, 2015

(65) Prior Publication Data

US 2017/0038428 A1    Feb. 9, 2017

(30) Foreign Application Priority Data

Aug. 5, 2015  (KR) .................. 10-2015-0110428

(51) Int. Cl.
*G11C 7/10* (2006.01)
*G11C 7/00* (2006.01)
*G11C 29/00* (2006.01)

(52) U.S. Cl.
CPC .................................. *G11C 29/00* (2013.01)

(58) Field of Classification Search
None
See application file for complete search history.

(56) References Cited

U.S. PATENT DOCUMENTS

| | | | |
|---|---|---|---|
| 2002/0093862 A1* | 7/2002 | Akioka | G11C 29/12 365/201 |
| 2006/0092728 A1* | 5/2006 | Lim | G11C 29/46 365/201 |
| 2008/0291765 A1 | 11/2008 | Smith | |
| 2012/0250435 A1* | 10/2012 | Matsunaga | G11C 7/12 365/194 |
| 2013/0265831 A1* | 10/2013 | Miyaji | G01R 31/2894 365/189.04 |

FOREIGN PATENT DOCUMENTS

KR    1020140139849 A    12/2014

* cited by examiner

*Primary Examiner* — Harry W Byrne
*Assistant Examiner* — Sultana Begum
(74) *Attorney, Agent, or Firm* — William Park & Associates Ltd.

(57) ABSTRACT

A semiconductor system may include a first semiconductor device and a second semiconductor device. The first semiconductor device may output a clock signal, a test mode signal and command address signals. The second semiconductor device may repeatedly write and read out data into and from a plurality of memory cells sequentially selected by addresses that are sequentially counted or may repeatedly write and read out the data into and from specific memory cells selected by a specific address among the addresses, according to the clock signal and the command address signals in response to the test mode signal.

20 Claims, 10 Drawing Sheets

COST EFFECTIVE SEMICONDUCTOR DEVICES AND SEMICONDUCTOR SYSTEMS WITH REDUCED TEST TIME

CROSS-REFERENCE TO RELATED APPLICATIONS

The present application claims priority under 35 U.S.C 119(a) to Korean Patent Application No. 10-2015-0110428, filed on Aug. 5, 2015, in the Korean Intellectual Property Office, which is incorporated herein by reference in its entirety as set forth in full.

BACKGROUND

1. Technical Field

Embodiments of the present disclosure generally relate to semiconductor devices having a test function and semiconductor systems including the same.

2. Related Art

Recently, as design schemes and manufacturing processes of semiconductor devices become more complicated, a process for testing the semiconductor devices has become more complicated and difficult. In addition, the semiconductor devices have become more highly integrated. Accordingly, a test time of the semiconductor devices may increase.

In order to cut the test cost with reduction of the test time, a method for testing the semiconductor devices during evaluation of the reliability of the semiconductor devices has been developed. As a typical example, a test during burn-in (hereinafter, referred to as TDBI) process performed after packaging the semiconductor devices has been proposed to reduce the test time. According to the TDBI process, a write operation of a semiconductor device encapsulated in a package form may be repeatedly executed with a simple test pattern to apply stress to the semiconductor device and a test for discriminating whether the semiconductor device normally operates or not may be executed. Specifically, during the TDBI process, the stress may be applied to the semiconductor device by repeatedly executing the write operation with a simple test pattern for a long time (e.g., a few hours maximally) at a relatively high temperature (e.g., about 100° C. maximally) with a relatively high power supply voltage.

In order to efficiently test semiconductor devices before packaging the semiconductor devices, a method for incorporating a built-in self-test (hereinafter, referred to as BIST) circuit into the semiconductor devices has been proposed. In addition, a design scheme for incorporating a built-in self-repair (hereinafter, referred to as BISR) circuit into the semiconductor devices has been proposed to increase yield of the semiconductor devices, and the design scheme has been widely used to repair defects detected by a wafer level burn-in (WBI) test. Here, the BISR circuit of the semiconductor devices may include the BIST circuit, a built-in self-diagnostics (BISD) circuit, a built-in redundancy analysis (BIRA) circuit, or the like.

SUMMARY

Various embodiments are directed to semiconductor devices having a test function and semiconductor systems including the same.

According to an embodiment, a semiconductor system includes a first semiconductor device and a second semiconductor device. The first semiconductor device outputs a clock signal, a test mode signal and command address signals. The second semiconductor device repeatedly writes and reads out data into and from a plurality of memory cells sequentially selected by addresses that are sequentially counted or repeatedly writes and reads out the data into and from specific memory cells selected by a specific address among the addresses, according to the clock signal and the command address signals in response to the test mode signal.

According to another embodiment, a semiconductor device includes a command processor, an address generator and a memory area. The command processor generates first and second internal active signals and an internal precharge signal from command address signals in response to a test mode signal and generates an internal delay active signal and an internal delay precharge signal by delaying the first internal active signal and the internal precharge signal by a predetermined number of cycles of a clock signal. The address generator sequentially generates a plurality of addresses from the command address signals or generates a specific address among the plurality of addresses, in response to the test mode signal, the internal delay active signal and the internal delay precharge signal. The memory area repeatedly writes and reads out data into and from a plurality of memory cells which are selected by the addresses during an enable period of a bank active signal.

According to yet another embodiment, a semiconductor system includes a first semiconductor device and a second semiconductor device. The first semiconductor device outputs a clock signal, a test mode signal and command address signals. The second semiconductor device repeatedly writes and reads out data into and from a plurality of memory cells which are sequentially selected by addresses that are counted by the clock signal and the command address signals in response to the test mode signal.

According to yet another embodiment, the test mode signal is enabled to enter a test mode in which the data are repeatedly inputted and outputted to and from the plurality of memory cells that are selected by the addresses.

According to yet another embodiment, a combination of the command address signals, the second semiconductor device repeatedly writes and reads out the data into and from the plurality of memory cells which are sequentially selected by the addresses that are sequentially counted.

According to yet another embodiment, the second memory device includes a command processor, a bank active signal generation circuit, a counter and a memory area. The command processor suitable for generating first and second internal active signals and an internal precharge signal from the command address signals in response to the test mode signal, suitable for generating a precharge signal which is enabled if a combination of the command address signals is a predetermined combination, and suitable for generating an internal delay precharge signal by delaying the internal precharge signal by a predetermined number of cycles of the clock signal. The bank active signal generation circuit suitable for generating a bank active signal, an enable period of the bank active signal is set by the first and second internal active signals and the internal precharge signal in response to the test mode signal. The counter suitable for generating the addresses which are counted in response to the precharge signal and the internal delay precharge signal. The memory area suitable for repeatedly inputting and outputting the data to and from the plurality of memory cells which are selected by the addresses during an enable period of the bank active signal.

According to yet another embodiment, the command processor includes a command decoder, a first delay circuit and a second delay circuit. The command decoder suitable for decoding the command address signals in synchronization with the clock signal in response to the test mode signal to generate the first and second internal active signals and the internal precharge signal. The first delay circuit suitable for delaying the first internal active signal by a predetermined number of cycles of the clock signal in response to a shifting signal to generate an internal delay active signal. The second delay circuit suitable for delaying the internal precharge signal by a predetermined number of cycles of the clock signal in response to the shifting signal to generate the internal delay precharge signal.

According to yet another embodiment, the shifting signal is a signal which sets a delay time for delaying the first internal active signal and the internal precharge signal by a predetermined number of cycles of the clock signal.

According to yet another embodiment, the bank active signal generation circuit includes a pull-up signal generation circuit, a pull-down signal generation circuit, a drive circuit and a latch circuit. The pull-up signal generation circuit suitable for generating a pull-up signal which is enabled if at least one of the precharge signal and the internal precharge signal is inputted. The pull-down signal generation circuit suitable for generating a pull-down signal which is enabled in response to the test mode signal and the first internal active signal if the second internal active signal is inputted. The drive circuit suitable for driving an internal node in response to the pull-up signal and the pull-down signal. The latch circuit suitable for latching a signal of the internal node and suitable for inversely buffering the signal of the internal node to generate the bank active signal.

According to yet another embodiment, a semiconductor device includes a command processor and a memory area. The command processor suitable for receiving a clock signal, a test mode signal, and command address signals. The memory area coupled to the command processor and suitable for repeatedly writing and reading out data into and from a plurality of memory cells sequentially selected by addresses that are sequentially counted or repeatedly writing and reading out the data into and from specific memory cells selected by a specific address among the addresses, according to the clock signal and the command address signals in response to the test mode signal, wherein the plurality of memory cells include the specific memory cells.

According to yet another embodiment, the test mode signal is enabled to operate the semiconductor device into a test mode in which the data is repeatedly inputted and outputted to and from the plurality of memory cells selected by the addresses.

According to yet another embodiment, if a combination of the command address signals is a first combination, the second semiconductor device repeatedly writes and reads out the data into and from the specific memory cells selected by the specific address that are generated from the command address signals.

According to yet another embodiment, if a combination of the command address signals is a second combination, the second semiconductor device repeatedly writes and reads out the data into and from the plurality of memory cells sequentially selected by the addresses that are sequentially counted.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
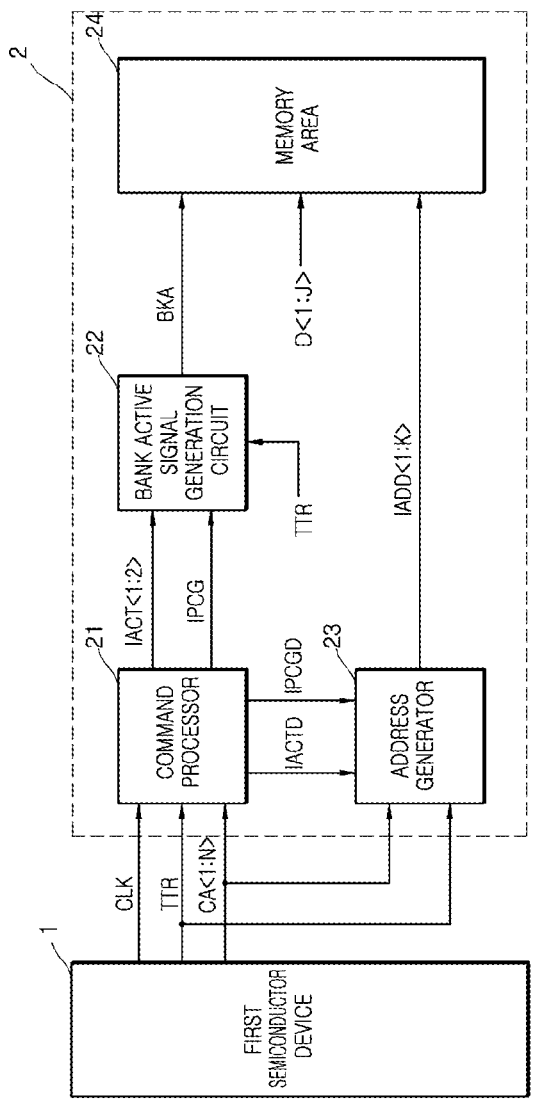
FIG. 1 is a block diagram illustrating a representation of an example of a configuration of a semiconductor system according to an embodiment of the present disclosure.

Referring to FIG. 1, a semiconductor system according to an embodiment of the present disclosure may include a first semiconductor device 1 and a second semiconductor device 2. The second semiconductor device 2 may include a command processor 21, a bank active signal generation circuit 22, an address generator 23, and a memory area 24.

The first semiconductor device 1 may output a clock signal CLK, a test mode signal TTR, and command address signals CA<1:N>. The clock signal CLK may be generated as a signal which periodically toggles. The clock signal CLK may be set as a signal for synchronizing operations of the first semiconductor device 1 and the second semiconductor device 2 with each other. The test mode signal TTR may be set as a signal which is enabled to enter a test mode in which data are repeatedly inputted to and outputted from a plurality of memory cells to apply stress to the plurality of memory cells. The command address signals CA<1:N> may be transmitted through lines that transmit at least one group of address signals, command signals, and data. The command address signals CA<1:N> may be continuously transmitted through one line. The number of bits included in the command address signals CA<1:N> may be set differently according to the embodiments. The first semiconductor device 1 may be configured using a controller which controls an operation of the second semiconductor device 2 or using a test instrument which tests the second semiconductor device 2 to repair failed memory cells of the second semiconductor device 2.

The command processor 21 may generate first and second internal active signals IACT<1:2> and an internal precharge signal IPCG from the command address signals CA<1:N> in response to the test mode signal TTR and may generate an internal delay active signal IACTD and an internal delay precharge signal IPCGD by delaying the first internal active signal IACT<1> and the internal precharge signal IPCG by a predetermined number of cycles of the clock signal CLK. A combination of the command address signals CA<1:N> for generating the first and second internal active signals IACT<1:2> and the internal precharge signal IPCG may be set differently according to the embodiments. For example, the command processor 21 may generate the first and second internal active signals IACT<1:2> if the combination of the command address signals CA<1:N> is a first combination and may generate the internal precharge signal IPCG if the combination of the command address signals CA<1:N> is a second combination.

The bank active signal generation circuit 22 may generate a bank active signal BKA. The enable period of the bank active signal BKA may beset by the first and second internal active signals IACT<1:2> and the internal precharge signal IPCG in response to the test mode signal TTR. The bank active signal BKA is illustrated as one signal, but may be generated as a plurality of signals according to embodiments.

The address generator 23 may generate one address of addresses IADD<1:K> from the command address signals CA<1:N> or may sequentially generate the addresses IADD<1:K> that are counted, in response to the test mode signal TTR, the internal delay active signal IACTD, and the internal delay precharge signal IPCGD.

The memory area 24 may include a plurality of memory cells (not illustrated) and may repeatedly write and read out data D<1:J> into and from the memory cells which are selected by the addresses IADD<1:K> during an enabled period of the bank active signal BKA. The number of bits of the data D<1:J> may be set differently according to the embodiments. For example, the number of bits of the data D<1:J> may be set to 16 if a burst length is set to 16, and the number of bits of the data D<1:J> may be set to 8 if the burst length is set to 8. Here, the burst length means the number of databits which are successively inputted into or outputted from the memory area 24 in response to a single write command or a single read command.

The second semiconductor device 2 may repeatedly write and read out the data D<1:J> into and from specific memory cells (not illustrated) selected by any one address among the addresses IADD<1:K> or may repeatedly write and read out the data D<1:J> into and from the plurality of memory cells (not illustrated) sequentially selected by the addresses IADD<1:K>, according to the clock signal CLK and the command address signals CA<1:N> in response to the test mode signal TTR. The first semiconductor device 1 may detect logic levels of the data D<1:J> which are inputted to and outputted from the second semiconductor device 2 to confirm addresses of failed memory cells or positions of failed memory cell arrays and may execute a repair operation of the failed memory cells or the failed memory cell arrays.

Figure 2:
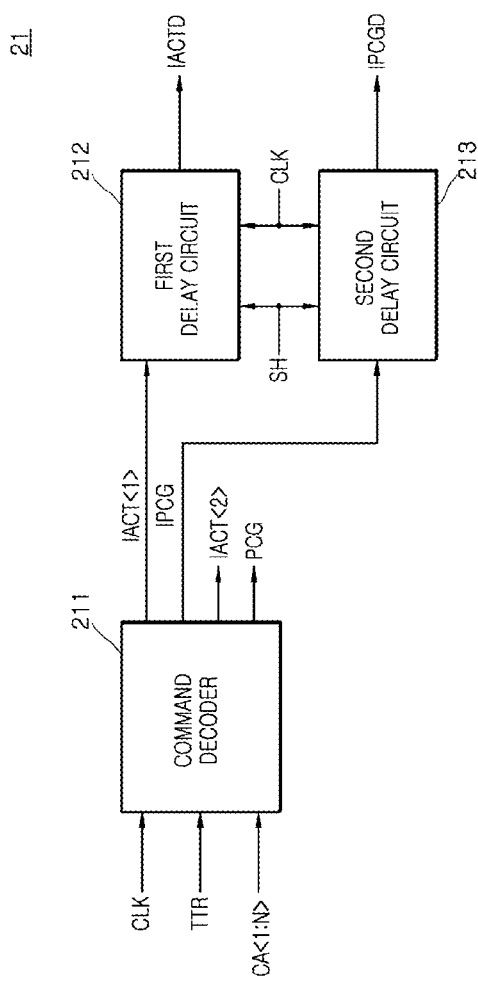
FIG. 2 is a block diagram illustrating a representation of an example of a configuration of a command processor included in a second semiconductor device illustrated in FIG. 1.

Referring to FIG. 2, the command processor 21 may include a command decoder 211, a first delay circuit 212, and a second delay circuit 213.

The command decoder 211 may decode the command address signals CA<1:N> in synchronization with the clock signal CLK and in response to the test mode signal TTR to generate precharge signals PCG, the first and second internal active signals IACT<1:2> and the internal precharge signal IPCG. The command decoder 211 may generate the precharge signal PCG if the combination of the command address signals CA<1:N> is a first combination, may generate the first and second internal active signals IACT<1:2> if the combination of the command address signals CA<1: N> is a second combination, and may generate the internal precharge signal IPCG if the combination of the command address signals CA<1:N> is a third combination.

The first delay circuit 212 may delay the first internal active signal IACT<1> by a predetermined number of cycles of the clock signal CLK in response to a shifting signal SH to generate the internal delay active signal IACTD.

The second delay circuit 213 may delay the internal precharge signal IPCG by a predetermined number of cycles of the clock signal CLK in response to the shifting signal SH to generate the internal delay precharge signal IPCGD.

The shifting signal SH is illustrated as one signal, but may be set to a plurality of bits in order to set a delay time for delaying the first internal active signal IACT<1> and the internal precharge signal IPCG by a predetermined number of cycles of the clock signal CLK. The predetermined number of cycles of the clock signal CLK may mean the number of toggling times of the clock signal CLK in a given duration.

Figure 3:
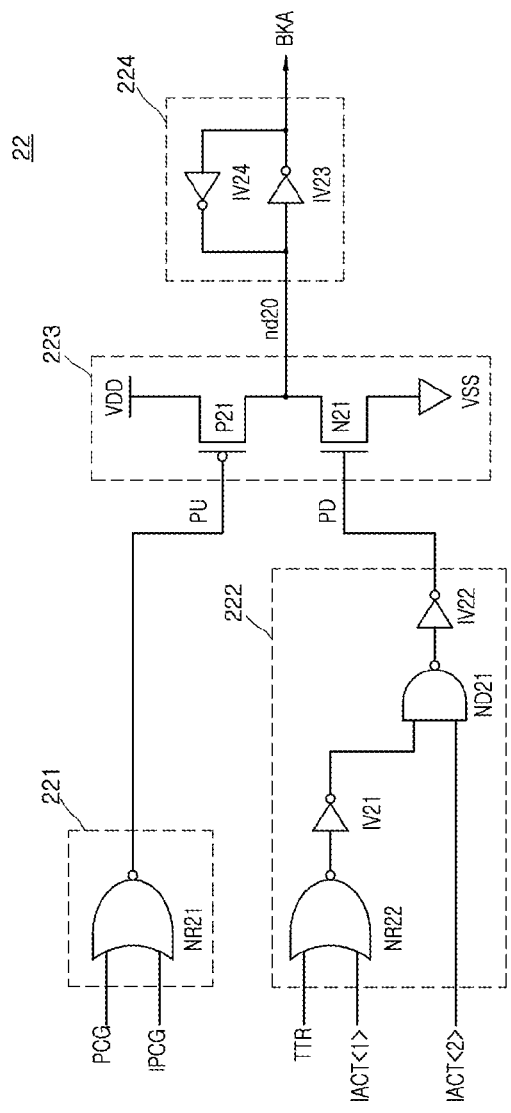
FIG. 3 is a circuit diagram illustrating a representation of an example of a configuration of a bank active signal generation circuit included in the second semiconductor device illustrated in FIG. 1.

Referring to FIG. 3, the bank active signal generation circuit 22 may include a pull-up signal generation circuit 221, a pull-down signal generation circuit 222, a drive circuit 223, and a latch circuit 224.

The pull-up signal generation circuit 221 may be realized using a logic gate, for example but not limited to, a NOR gate NR21 to generate a pull-up signal PU which is enabled to a logic low level if at least one of the precharge signal PCG and the internal precharge signal IPCG has a logic high level.

The pull-down signal generation circuit 222 may be configured by, a logic gate, for example but not limited to, a NOR gate NR22, a NAND gate ND21, and inverters IV21 and IV22 to generate a pull-down signal PD which is enabled to a logic high level if at least one of the test mode signal TTR and the first internal active signal IACT<1> has a logic high level and the second internal active signal IACT<2> has a logic high level.

The drive circuit 223 may be configured by, for example but not limited to, a PMOS transistor P21 and an NMOS transistor N21 which are coupled in series between a power supply voltage VDD terminal and a ground voltage VSS terminal to drive an internal node nd20 in response to the pull-up signal PU and the pull-down signal PD.

The latch circuit 224 may latch a signal of the internal node nd20 and may inversely buffer the signal of the internal node nd20 to generate the bank active signal BKA.

Figure 4:
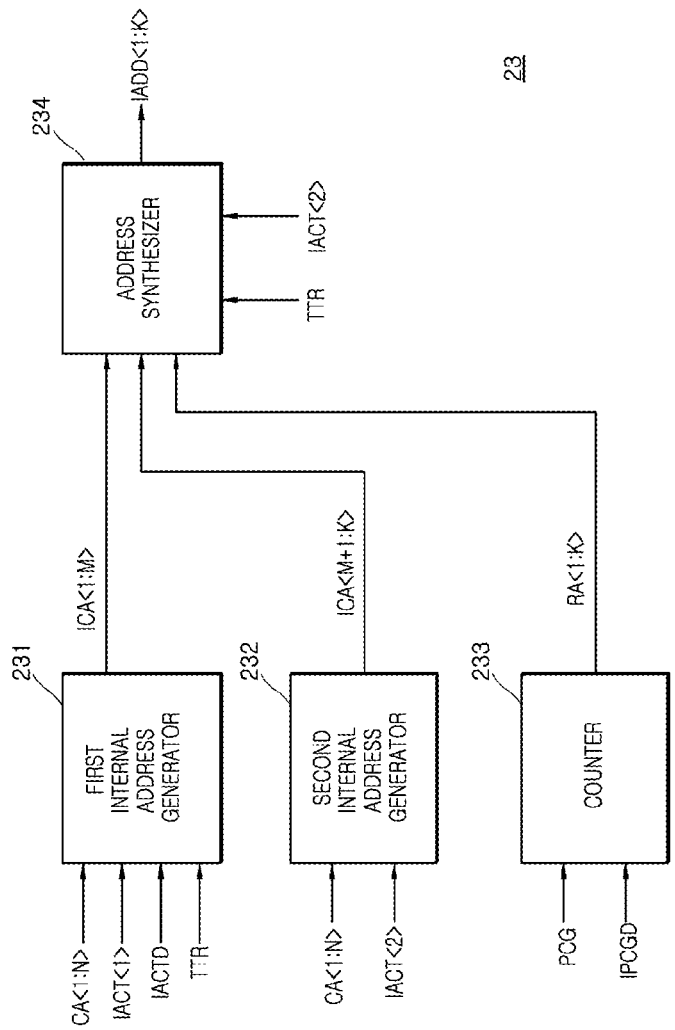
FIG. 4 is a block diagram illustrating a representation of an example of a configuration of an address generator included in the second semiconductor device illustrated in FIG. 1.

Referring to FIG. 4, the address generator 23 may include a first internal address generator 231, a second internal address generator 232, a counter 233, and an address synthesizer 234.

The first internal address generator 231 may latch the command address signals CA<1:N> at a point of time that the first internal active signal IACT<1> is inputted in response to the test mode signal TTR and may output the latched command address signals CA<1:N> as first internal address signals ICA<1:M> at a point of time that the internal delay active signal IACTD is inputted. In some embodiments, the first internal address generator 231 may be configured such that some bits of the command address signals CA<1:N> are latched and outputted as the first internal address signals ICA<1:M>.

The second internal address generator 232 may output the command address signals CA<1:N> as second internal address signals ICA<M+1:K> at a point of time that the second internal active signal IACT<2> is inputted. In some embodiments, the second internal address generator 232 may be configured such that some bits of the command address signals CA<1:N> are latched and outputted as the second internal address signals ICA<M+1:K>.

The counter 233 may generate row address signals RA<1:J> which are counted in response to the precharge signal PCG and the internal delay precharge signal IPCGD.

The address synthesizer 234 may synthesize the first internal address signals ICA<1:M> and the second internal address signals ICA<M+1:K> in response to the test mode signal TTR and the second internal active signal IACT<2> to output the synthesized signals as the addresses IADD<1:K>. The address synthesizer 234 may transmit the row address signals RA<1:K> as the addresses IADD<1:K> if the row address signals RA<1:K> are generated.

The bit number K of the addresses IADD<1:K> may be set to a sum of bits of the first internal address signals ICA<1:M> and bits of the second internal address signals ICA<M+1:K> and may be set differently in accordance with the embodiments.

An operation of the semiconductor system having an aforementioned configuration will be described hereinafter with reference to FIG. 5 and FIG. 6 in conjunction with an example in which the burst length is set to "16" and an example in which the burst length is set to "8". In the following operation, data of the memory cells selected by the addresses IADD<1:K> generated from the command address signals CA<1:N> may be repeatedly outputted. Burst lengths may be set differently according to different embodiments.

First, an operation in which the burst length is set to "16" and the data of the memory cells selected by the addresses IADD<1:K> generated from the command address signals CA<1:N> are repeatedly outputted will be described hereinafter with reference to FIG. 5.

Figure 5:
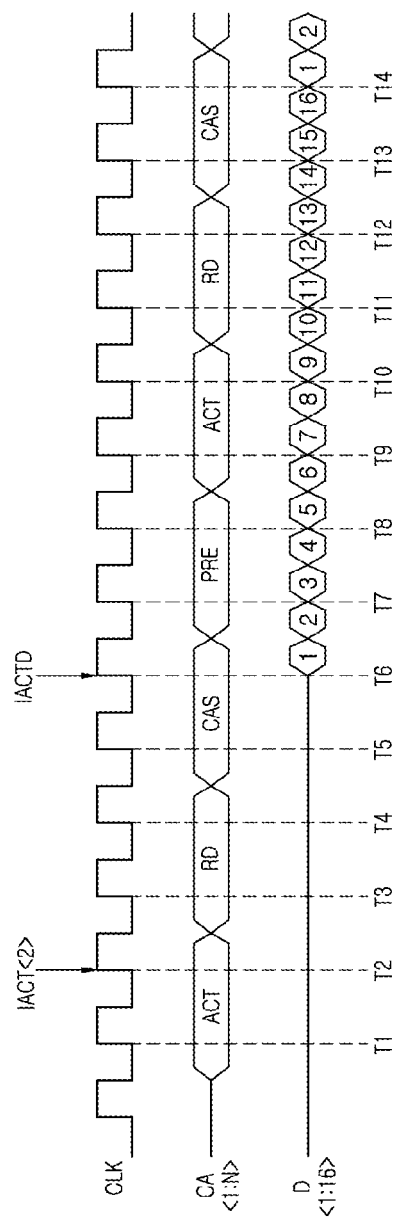
FIG. 5 and FIG. 6 are timing diagrams illustrating a representation of an example of an operation of a semiconductor system according to an embodiment of the present disclosure.

Referring to FIG. 5, points of time T1 to T14 are sequentially indicated at rising edges of the clock signal CLK that continuously toggles, respectively.

At the point of time T1, the first semiconductor device 1 may output the combination of the command address signals CA<1:N> as a combination for an active operation ACT. The active operation ACT may correspond to an operation for activating word lines coupled to the memory cells of the memory area 24.

At the point of time T2, the command processor 21 may generate the second internal active signal IACT<2> from the command address signals CA<1:N>. The bank active signal generation circuit 22 may receive the second internal active signal IACT<2> to generate the bank active signal BKA which is enabled.

At the point of time T3, the first semiconductor device 1 may output the combination of the command address signals CA<1:N> as a combination for a read operation RD. The read operation RD may correspond to an operation for outputting data stored in the memory cells connected to the activated word line.

At the point of time T5, the first semiconductor device 1 may output the combination of the command address signals CA<1:N> as a combination for a column address strobe (CAS) operation CAS. The CAS operation CAS may correspond to an operation for outputting the data read out from the memory cells to an external device through input/output (I/O) lines.

At the point of time T6, the command processor 21 may generate the internal delay active signal IACTD from the command address signals CA<1:N>.

The address generator 23 may generate the addresses IADD<1:K> from the command address signals CA<1:N>.

The memory area 24 may sequentially output the first to sixteenth data D<1:16> from the memory cells which are selected by the bank active signal BKA and the addresses IADD<1:K>.

At the point of time T7, the first semiconductor device 1 may output the combination of the command address signals CA<1:N> as a combination for a precharge operation PRE. The precharge operation PRE may correspond to an operation that drives a level of bit lines coupled to the memory cells to an intermediate level between the power supply voltage VDD and the ground voltage VSS for the next read operation.

Operations executed at the points of time T8 to T13 are the same as the operations executed at the points of time T1 to T7. Thus, descriptions of the operations executed at the points of time T8 to T13 will be omitted hereinafter.

At the point of time T14, the memory area 24 may sequentially output the first to sixteenth data D<1:16> from the memory cells which are selected by the bank active signal BKA and the addresses IADD<1:K>.

The first semiconductor device 1 may sense levels of the first to sixteenth data D<1:16> to perform a repair operation of failed memory cells if the memory area 24 has at least one failed memory cells.

Subsequently, an operation in which the burst length is set to "8" and the data of the memory cells selected by the addresses IADD<1:K> generated from the command address signals CA<1:N> are repeatedly outputted will be described hereinafter with reference to FIG. 6.

Figure 6:
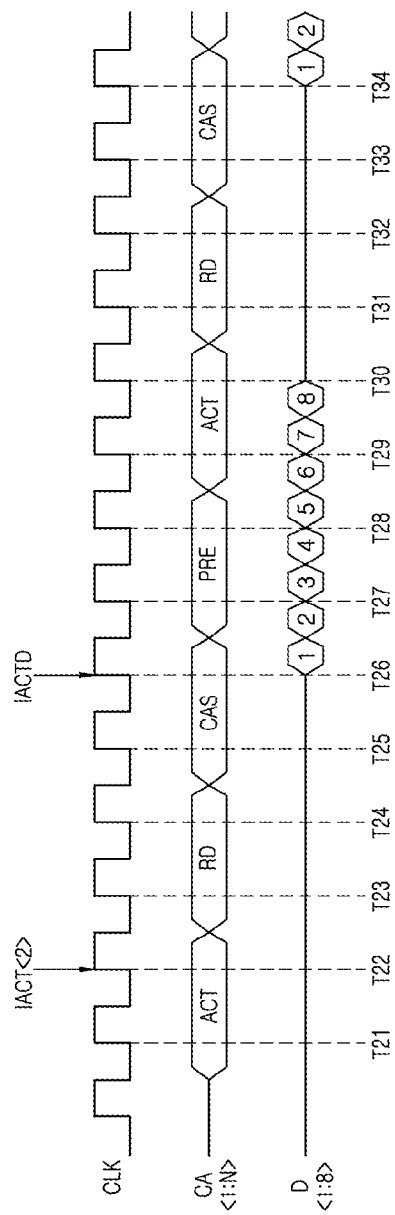

Referring to FIG. 6, points of time T21 to T34 are sequentially indicated at rising edges of the clock signal CLK that continuously toggles, respectively.

At the point of time T21, the first semiconductor device 1 may output the combination of the command address signals CA<1:N> as a combination for the active operation ACT. The active operation ACT may correspond to an operation for activating word lines coupled to the memory cells of the memory area 24.

At the point of time T22, the command processor 21 may generate the second internal active signal IACT<2> from the command address signals CA<1:N>. The bank active signal generation circuit 22 may receive the second internal active signal IACT<2> to generate the bank active signal BKA which is enabled.

At the point of time T23, the first semiconductor device 1 may output the combination of the command address signals CA<1:N> as the combination for the read operation RD. The read operation RD may correspond to the operation for outputting data from the memory cells connected to the activated word line.

At the point of time T25, the first semiconductor device 1 may output the combination of the command address signals CA<1:N> as the combination for the CAS operation CAS. The CAS operation CAS may correspond to the operation for outputting the data read out from the memory cells to an external device through input/output (I/O) lines.

At the point of time T26, the command processor 21 may generate the internal delay active signal IACTD from the command address signals CA<1:N>.

The address generator 23 may generate the addresses IADD<1:K> from the command address signals CA<1:N>.

The memory area 24 may sequentially output the first to eighth data D<1:8> from the memory cells which are selected by the bank active signal BKA and the addresses IADD<1:K>.

At the point of time T27, the first semiconductor device 1 may output the combination of the command address signals CA<1:N> as the combination for the precharge operation PRE. The precharge operation PRE may correspond to the operation that drives a level of bit lines coupled to the memory cells to an intermediate level between the power supply voltage VDD and the ground voltage VSS for the next read operation.

Operations executed at the points of time T28 to T33 are the same as the operations executed at the points of time T21 to T27. Thus, descriptions of the operations executed at the points of time T28 to T33 will be omitted hereinafter.

At the point of time T34, the memory area 24 may sequentially output the first to eighth data D<1:8> from the memory cells which are selected by the bank active signal BKA and the addresses IADD<1:K>.

The first semiconductor device 1 may sense levels of the first to eighth data D<1:8> to perform a repair operation of failed memory cells if the memory area 24 has at least one failed memory cell.

As described above, the semiconductor system having an aforementioned configuration may repeatedly write and read out data into and from a plurality of memory cells in a test mode to apply stress to memory cells or memory cell arrays included in a semiconductor device of the semiconductor system and may confirm whether the semiconductor device has at least one failed memory cell or at least one failed memory cell array due to the stress. The semiconductor system may execute a repair operation if the semiconductor device has at least one failed memory cell or at least one failed memory cell array.

Figure 7:
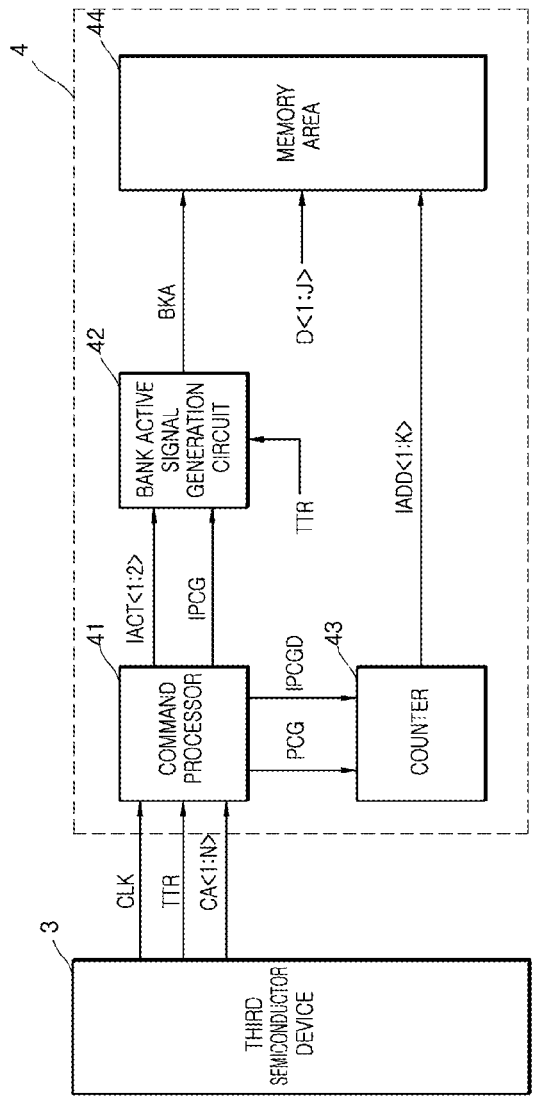
FIG. 7 is a block diagram illustrating a representation of an example of a configuration of a semiconductor system according to an embodiment of the present disclosure.

Referring to FIG. 7, a semiconductor system according to an embodiment of the present disclosure may include a third semiconductor device 3 and a fourth semiconductor device 4. The fourth semiconductor device 4 may include a command processor 41, a bank active signal generation circuit 42, a counter 43, and a memory area 44.

The third semiconductor device 3 may output the clock signal CLK, the test mode signal TTR, and the command address signals CA<1:N>. The clock signal CLK may be generated as a signal which periodically toggles. The clock signal CLK may be set as a signal for synchronizing operations of the third semiconductor device 3 and the fourth semiconductor device 4 with each other. The test mode signal TTR may be set as a signal which is enabled to enter the test mode in which data are repeatedly inputted and outputted to and outputted from a plurality of memory cells to apply stress to the plurality of memory cells. The command address signals CA<1:N> may be transmitted through lines that transmit at least one group of address signals, command signals, and data. In addition, the command address signals CA<1:N> may be continuously transmitted through one line. The number of bits included in the command address signals CA<1:N> may be set differently according to the embodiments. The third semiconductor device 3 may be configured using a controller which controls an operation of the fourth semiconductor device 4 or using a test instrument which tests the fourth semiconductor device 4 to repair failed memory cells.

The command processor 41 may generate the first and second internal active signals IACT<1:2>, the internal precharge signal IPCG, and the precharge signal PCG from the command address signals CA<1:N> in response to the test mode signal TTR and may generate the internal delay precharge signal IPCGD by delaying the internal precharge signal IPCG by a predetermined number of cycles of the clock signal CLK. A combination of the command address signals CA<1:N> for generating the first and second internal active signals IACT<1:2>, the internal precharge signal IPCG, and the precharge signal PCG may be set differently according to the embodiments. For example, the command processor 41 may generate the first and second internal active signals IACT<1:2> if the combination of the command address signals CA<1:N> is a first combination, may generate the internal precharge signal IPCG if the combination of the command address signals CA<1:N> is a second combination, and may generate the precharge signal PCG if the combination of the command address signals CA<1:N> is a third combination. The command processor 41 may have the same configuration and operation as the command processor 21 illustrated FIG. 2. Thus, a description thereof will be omitted hereinafter.

The bank active signal generation circuit 42 may generate the bank active signal BKA. The enable period of the bank active signal BKA may be set by the first and second internal active signals IACT<1:2> and the internal precharge signal IPCG in response to the test mode signal TTR. The bank active signal BKA is illustrated as one signal, but may be generated to have a plurality of signals according to the embodiments. The bank active signal generation circuit 42 may have the same configuration and operation as the bank active signal generation circuit 22 illustrated in FIG. 3. Thus, a description thereof will be omitted hereinafter.

The counter 43 may generate the addresses IADD<1:K> which are counted in response to the precharge signal PCG and the internal delay precharge signal IPCGD. The counter 43 may have the same configuration and operation as the counter 233 included in the address generator 23 illustrated in FIG. 4 except I/O signals. Thus, a description thereof will be omitted hereinafter.

The memory area 44 may repeatedly input and output data D<1:J> to and from a plurality of memory cells (not illustrated) which are selected by the addresses IADD<1:K> during an enable period of the bank active signal BKA. The number of bits of the data D<1:J> may be set differently according to the embodiments. For example, the number of bits of the data D<1:J> may be set to "16" if a burst length is set to 16, and the number of bits of the data D<1:J> may be set to "8" if the burst length is set to 8. The burst length may mean the number of data bits which are successively inputted into or outputted from the memory area 24 in response to a single write command or a single read command.

The fourth semiconductor device 4 may repeatedly write and read out the data D<1:J> into and from specific memory cells (not illustrated) selected by any one address among the addresses IADD<1:K> or may repeatedly write and read out the data D<1:J> into and from the plurality of memory cells (not illustrated) sequentially selected by the addresses IADD<1:K>, according to the clock signal CLK and the command address signals CA<1:N> in response to the test mode signal TTR. The third semiconductor device 3 may detect logic levels of the data D<1:J> which are inputted to and outputted from the fourth semiconductor device 4 to confirm addresses of failed memory cells or positions of failed memory cell arrays and may execute a repair operation of the failed memory cells or the failed memory cell arrays.

An operation of the semiconductor system having the an aforementioned configuration will be described with reference to FIG. 8 and FIG. 9 in conjunction with an example in which the burst length is set to "16" and an example in which the burst length is set to "8". In the following operation, data of the memory cells selected by the addresses IADD<1:K> counted by the command address signals CA<1:N> may be repeatedly outputted.

First, an operation in which the burst length is set to "16" and the data of the memory cells selected by the addresses IADD<1:K> counted by the command address signals CA<1:N> are repeatedly outputted will be described hereinafter with reference to FIG. 8.

Figure 8:
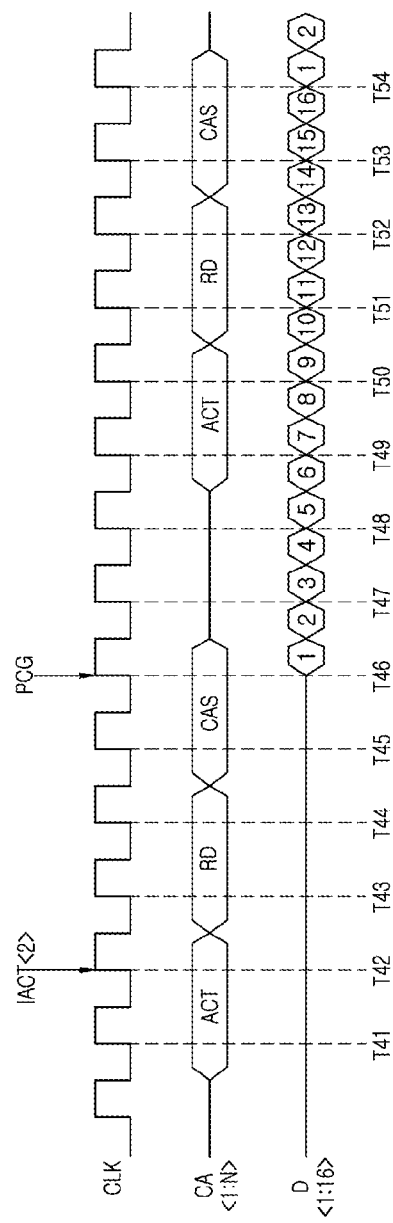
FIG. 8 and FIG. 9 are timing diagrams illustrating a representation of examples of an operation of a semiconductor system according to an embodiment of the present disclosure.

Referring to FIG. 8, points of time T41 to T54 are sequentially indicated at rising edges of the clock signal CLK that continuously toggles, respectively.

At the point of time T41, the third semiconductor device 3 may output the combination of the command address signals CA<1:N> as a combination for the active operation ACT. The active operation ACT may correspond to an operation for activating word lines coupled to the memory cells of the memory area 44.

At the point of time T42, the command processor 41 may generate the second internal active signal IACT<2> from the command address signals CA<1:N>. The bank active signal generation circuit 42 may receive the second internal active signal IACT<2> to generate the bank active signal BKA which is enabled.

At the point of time T43, the third semiconductor device 3 may output the combination of the command address signals CA<1:N> as a combination for the read operation RD. The read operation RD may correspond to an operation for outputting data from the memory cells connected to the activated word lines.

At the point of time T45, the third semiconductor device 3 may output the combination of the command address signals CA<1:N> as a combination for the CAS operation CAS. The CAS operation CAS may correspond to an operation for outputting the data read out from the memory cells to an external device through I/O lines.

At the point of time T46, the command processor 41 may generate the precharge signal PCG from the command address signals CA<1:N>.

The counter 43 may receive the precharge signal PCG to generate the addresses IADD<1:K> which are counted.

The memory area 44 may sequentially output the first to sixteenth data D<1:16> from the memory cells which are selected by the bank active signal BKA and the addresses IADD<1:K>.

Operations executed at points of time T47 to T53 are the same as the operations executed at the points of time T41 to T46. Thus, descriptions of the operations executed at the points of time T47 to T53 will be omitted hereinafter.

At the point of time T54, the memory area 44 may sequentially output the first to sixteenth data D<1:16> from the memory cells which are selected by the bank active signal BKA and the addresses IADD<1:K>.

The third semiconductor device 3 may sense levels of the first to sixteenth data D<1:16> to perform a repair operation of failed memory cell if the memory area 44 has at least one failed memory cell.

Subsequently, an operation in which the burst length is set to "8" and the data of the memory cells selected by the addresses IADD<1:K> counted by the command address signals CA<1:N> are repeatedly outputted will be described hereinafter with reference to FIG. 9.

Figure 9:
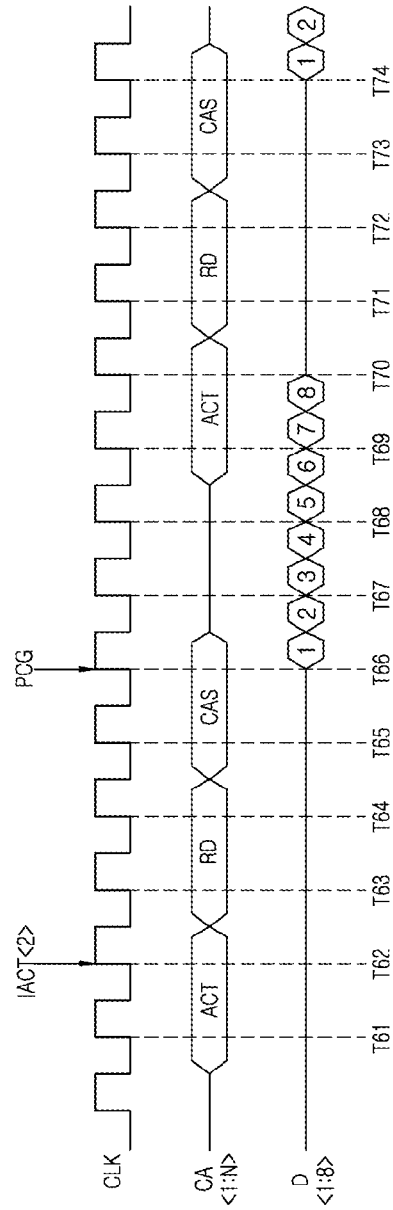

Referring to FIG. 9, points of time T61 to T74 are sequentially indicated at rising edges of the clock signal CLK that continuously toggles, respectively.

At the point of time T61, the third semiconductor device 3 may output the combination of the command address signals CA<1:N> as a combination for the active operation ACT. The active operation ACT may correspond to an operation for activating word lines coupled to the memory cells of the memory area 44.

At the point of time T62, the command processor 41 may generate the second internal active signal IACT<2> from the command address signals CA<1:N>. The bank active signal generation circuit 42 may receive the second internal active signal IACT<2> to generate the bank active signal BKA which is enabled.

At the point of time T63, the third semiconductor device 3 may output the combination of the command address signals CA<1:N> as the combination for the read operation RD. The read operation RD may correspond to outputting data from the memory cells connected to the activated word line.

At the point of time T65, the third semiconductor device 3 may output the combination of the command address signals CA<1:N> as the combination for the CAS operation CAS. The CAS operation CAS may correspond to the operation for outputting the data read out from the memory cells to an external device through I/O lines.

At the point of time T66, the command processor 41 may generate the precharge signal PCG from the command address signals CA<1:N>.

The counter 43 may receive the precharge signal PCG to generate the addresses IADD<1:K> which are counted.

The memory area 44 may sequentially output the first to eighth data D<1:8> from the memory cells which are selected by the bank active signal BKA and the addresses IADD<1:K>.

Operations executed at the points of time T67 to T73 are the same as the operations executed at the points of time T61 to T66. Thus, descriptions of the operations executed at the points of time T67 to T73 will be omitted hereinafter.

At the point of time T74, the memory area 44 may sequentially output the first to eighth data D<1:8> from the memory cells which are selected by the bank active signal BKA and the addresses IADD<1:K>.

The third semiconductor device 3 may sense levels of the first to eighth data D<1:8> to perform a repair operation of the failed memory cells if the memory area 44 has at least one failed memory cell.

As described above, the semiconductor system having aforementioned configuration may repeatedly write and read out data into and from a plurality of memory cells in a test mode to apply stress to memory cells or memory cell arrays included in a semiconductor device of the semiconductor system and may confirm whether the semiconductor device has at least one failed memory cell or at least one failed memory cell array due to the stress. The semiconductor system may execute a repair operation if the semiconductor device has at least one failed memory cell or at least one failed memory cell array.

Figure 10:
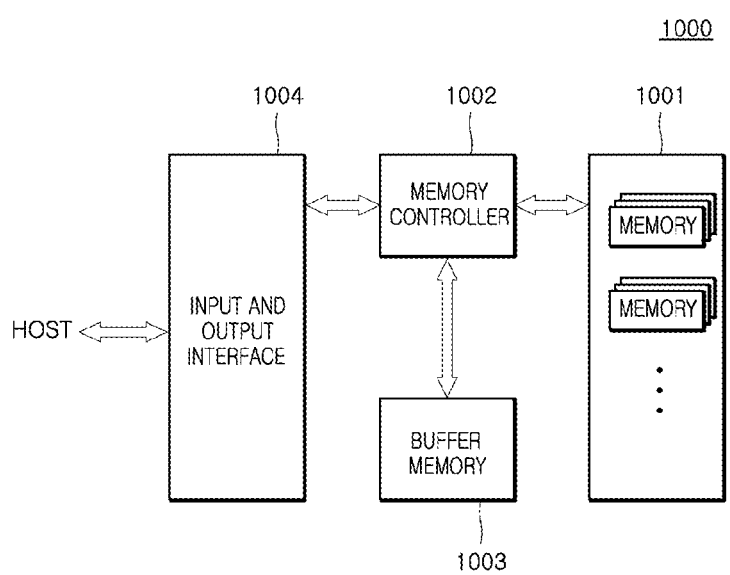
FIG. 10 illustrates a representation of an example of a configuration of an electronic system including any one of the semiconductor systems illustrated in FIG. 1 to FIG. 9.

At least one of the semiconductor devices or at least one of the semiconductor systems described with reference to FIGS. 1 to 9 may be applied to an electronic system that may include a memory system, a graphic system, a computing system, a mobile system, or the like. For example, an electronic system 1000 according an embodiment may include a data storage unit 1001, a memory controller 1002, a buffer memory 1003, and an I/O interface 1004, as illustrated in FIG. 10.

The data storage unit 1001 may store data which are outputted from the memory controller 1002 or may read and output the stored data to the memory controller 1002, according to a control signal generated from the memory controller 1002. The data storage unit 1001 may include the second semiconductor device 2 illustrated in FIG. 1 or the fourth semiconductor device 4 illustrated in FIG. 7. The data storage unit 1001 may include a nonvolatile memory that can retain stored data even when the power supply to the nonvolatile memory is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 1 illustrated in FIG. 1 or the third semiconductor device 3 illustrated in FIG. 7. Although FIG. 10 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data which are processed by the memory controller 1002. The buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). The memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
    a first semiconductor device suitable for outputting a clock signal, a test mode signal, and command address signals; and
    a second semiconductor device suitable for repeatedly writing and reading out data into and from a plurality of memory cells sequentially selected by addresses that are sequentially counted internally or repeatedly writing and reading out the data into and from specific memory cells selected by a specific address among the addresses, according to the clock signal and the command address signals in response to the test mode signal,
    wherein the plurality of memory cells include the specific memory cells,
    wherein the second semiconductor device includes:
    a command processor suitable for generating first and second internal active signals and an internal precharge signal from the command address signals in response to the test mode signal and suitable for generating an internal delay active signal and an internal delay precharge signal by delaying the first internal active signal and the internal precharge signal by a predetermined number of cycles of the clock signal;
    a bank active signal generation circuit suitable for generating a bank active signal, an enable period of the bank active signal is set by the first and second internal active signals and the internal precharge signal in response to the test mode signal;
    an address generator suitable for generating the specific address or sequentially generating the plurality of addresses from the command address signals in response to the test mode signal, the internal delay active signal, and the internal delay precharge signal; and
    a memory area suitable for repeatedly inputting and outputting the data to and from the plurality of memory cells which are selected by the addresses during an enable period of the bank active signal.

2. The system of claim 1, wherein the test mode signal is enabled to enter a test mode in which the data are repeatedly inputted and outputted to and from the plurality of memory cells that are selected by the addresses.

3. The system of claim 1, wherein if a combination of the command address signals is a first combination, the second semiconductor device repeatedly writes and reads out the data into and from the specific memory cells which are selected by the specific address that is generated from the command address signals.

4. The system of claim 1, wherein if a combination of the command address signals is a second combination, the second semiconductor device repeatedly writes and reads out the data into and from the plurality of memory cells which are sequentially selected by the addresses that are sequentially counted.

5. The system of claim 1, wherein the command processor includes:
    a command decoder suitable for decoding the command address signals in synchronization with the clock signal in response to the test mode signal to generate a precharge signal, the first and second internal active signals and the internal precharge signal;
    a first delay circuit suitable for delaying the first internal active signal by a predetermined number of cycles of the clock signal in response to a shifting signal to generate the internal delay active signal; and
    a second delay circuit suitable for delaying the internal precharge signal by a predetermined number of cycles of the clock signal in response to the shifting signal to generate the internal delay precharge signal.

6. The system of claim 5, wherein the shifting signal is a signal which sets a delay time for delaying the first internal active signal and the internal precharge signal by a predetermined number of cycles of the clock signal.

7. The system of claim 1, wherein the bank active signal generation circuit includes:
- a pull-up signal generation circuit suitable for generating a pull-up signal which is enabled if at least one of the precharge signal and the internal precharge signal is inputted;
- a pull-down signal generation circuit suitable for generating a pull-down signal which is enabled in response to the test mode signal and the first internal active signal if the second internal active signal is inputted;
- a drive circuit suitable for driving an internal node in response to the pull-up signal and the pull-down signal; and
- a latch circuit suitable for latching a signal of the internal node and configured for inversely buffering the signal of the internal node to generate the bank active signal.

8. The system of claim 1, wherein the address generator includes:
- a first internal address generator suitable for latching the command address signals in response to the test mode signal and the first internal active signal and suitable for outputting the latched command address signals as first internal address signals in response to the internal delay active signal;
- a second internal address generator suitable for outputting the command address signals as second internal address signals in response to the second internal active signal; and
- an address synthesizer suitable for synthesizing the first internal address signals and the second internal address signals in response to the test mode signal and the second internal active signal to output the synthesized signals as the addresses.

9. The system of claim 8, wherein the number of bits of the addresses is equal to a sum of the number of bits of the first internal address signals and the number of bits of the second internal address signals.

10. The system of claim 8, further comprising:
- a counter suitable for generating row address signals which are counted in response to the precharge signal and the internal delay precharge signal.

11. The system of claim 10, wherein the address synthesizer outputs the row address signals as the addresses if the row address signals are generated.

12. A semiconductor device comprising:
- a command processor suitable for generating first and second internal active signals and an internal precharge signal from command address signals in response to a test mode signal and suitable for generating an internal delay active signal and an internal delay precharge signal by delaying the first internal active signal and the internal precharge signal by a predetermined number of cycles of a clock signal;
- an address generator suitable for sequentially generating a plurality of addresses from the command address signals or generating a specific address among the plurality of addresses, in response to the test mode signal, the internal delay active signal, and the internal delay precharge signal; and
- a memory area suitable for repeatedly writing and reading out data into and from a plurality of memory cells which are selected by the addresses during an enable period of a bank active signal.

13. The device of claim 12, wherein the test mode signal is enabled to enter a test mode in which the data are repeatedly inputted to and outputted from the plurality of memory cells that are selected by the addresses.

14. The device of claim 12, wherein the command processor includes:
- a command decoder suitable for decoding the command address signals in synchronization with the clock signal in response to the test mode signal to generate a precharge signal, the first and second internal active signals and the internal precharge signal;
- a first delay circuit suitable for delaying the first internal active signal by a predetermined number of cycles of the clock signal in response to a shifting signal to generate an internal delay active signal; and
- a second delay circuit suitable for delaying the internal precharge signal by a predetermined number of cycles of the clock signal in response to the shifting signal to generate the internal delay precharge signal.

15. The device of claim 14, wherein the shifting signal is a signal which sets a delay time for delaying the first internal active signal and the internal precharge signal by a predetermined number of cycles of the clock signal.

16. The device of claim 12, wherein the address generator includes:
- a first internal address generator suitable for latching the command address signals in response to the test mode signal and the first internal active signal and suitable for outputting the latched command address signals as first internal address signals in response to the internal delay active signal;
- a second internal address generator suitable for outputting the command address signals as second internal address signals in response to the second internal active signal; and
- an address synthesizer suitable for synthesizing the first internal address signals and the second internal address signals in response to the test mode signal and the second internal active signal to output the synthesized signals as the addresses.

17. The device of claim 16, wherein further comprising:
- a counter suitable for generating row address signals which are counted in response to the precharge signal and the internal delay precharge signal.

18. The device of claim 17, wherein the address synthesizer outputs the row address signals as the addresses if the row address signals are generated.

19. The device of claim 12, further comprising:
- a bank active signal generation circuit suitable for generating the bank active signal, the enable period of the bank active signal is set by the first and second internal active signals and the internal precharge signal in response to the test mode signal.

20. The device of claim 19, wherein the bank active signal generation circuit includes:
- a pull-up signal generation circuit suitable for generating a pull-up signal which is enabled if at least one of the precharge signal and the internal precharge signal is inputted;
- a pull-down signal generation circuit suitable for generating a pull-down signal which is enabled in response to the test mode signal and the first internal active signal if the second internal active signal is inputted;
- a drive circuit suitable for driving an internal node in response to the pull-up signal and the pull-down signal; and
- a latch circuit suitable for latching a signal of the internal node and suitable for inversely buffering the signal of the internal node to generate the bank active signal.

* * * * *